(12) United States Patent
Yantchev

(10) Patent No.: US 12,015,391 B2
(45) Date of Patent: *Jun. 18, 2024

(54) XBAR DEVICES WITH EXCESS PIEZOELECTRIC MATERIAL REMOVED

(71) Applicant: Murata Manufacturing Co., Ltd., Nagaokakyo (JP)

(72) Inventor: Ventsislav Yantchev, Sofia (BG)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/894,001

(22) Filed: Aug. 23, 2022

(65) Prior Publication Data

US 2022/0407495 A1 Dec. 22, 2022

Related U.S. Application Data

(63) Continuation of application No. 17/123,029, filed on Dec. 15, 2020, now Pat. No. 11,496,113.
(Continued)

(51) Int. Cl.
*H03H 9/02* (2006.01)
*H03H 9/205* (2006.01)
*H03H 9/56* (2006.01)

(52) U.S. Cl.
CPC .... *H03H 9/02157* (2013.01); *H03H 9/02015* (2013.01); *H03H 9/02228* (2013.01); *H03H 9/205* (2013.01); *H03H 9/568* (2013.01)

(58) Field of Classification Search
CPC .......... H03H 9/02157; H03H 9/02015; H03H 9/02228; H03H 9/205; H03H 9/568;
(Continued)

(56) References Cited

U.S. PATENT DOCUMENTS 5,204,575 A 4/1993 Kanda et al.
5,274,345 A 12/1993 Gau
(Continued)

FOREIGN PATENT DOCUMENTS

WO 2016017104 2/2016
WO 2018003273 1/2018

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Rakesh B Patel
*Assistant Examiner* — Jorge L Salazar, Jr.
(74) *Attorney, Agent, or Firm* — ARENTFOX SCHIFF LLP

(57) ABSTRACT

A filter device has a substrate with a first cavity and a second cavity on a single die; and a bonding layer formed on the substrate but not spanning the first cavity or the second cavity. A piezoelectric plate is bonded to the bonding layer and spans the first and the second cavity. However, excess portions of piezoelectric plate are removed that extend a certain length past the perimeter of the first cavity and of the second cavity. Excess portions may be piezoelectric material that extends in the length and width direction past the perimeter of a cavity by more than between 2 and 25 percent of the cavity perimeter. An interdigital transducer (IDT) is on a front surface of the piezoelectric plate and having interleaved fingers over the first cavity.

14 Claims, 12 Drawing Sheets

Related U.S. Application Data

(60) Provisional application No. 63/113,301, filed on Nov. 13, 2020.

(58) Field of Classification Search
CPC .... H03H 2003/023; H03H 3/02; H03H 9/605; H03H 9/174; H03H 9/588
USPC .......................................... 333/133, 193–196
See application file for complete search history.

(56) References Cited

U.S. PATENT DOCUMENTS

| | | | |
|---|---|---|---|
| 5,446,330 A | 8/1995 | Eda et al. | |
| 5,552,655 A | 9/1996 | Stokes et al. | |
| 5,726,610 A | 3/1998 | Allen et al. | |
| 5,729,186 A | 3/1998 | Seki et al. | |
| 5,853,601 A | 12/1998 | Krishaswamy | |
| 6,172,582 B1 | 1/2001 | Hickernell | |
| 6,271,617 B1 | 8/2001 | Yoneda et al. | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,570,470 B2 | 5/2003 | Maehara et al. | |
| 6,707,229 B1 | 3/2004 | Martin | |
| 6,710,514 B2 | 3/2004 | Ikada et al. | |
| 6,833,774 B2 | 12/2004 | Abbott et al. | |
| 7,009,468 B2 | 3/2006 | Kadota et al. | |
| 7,105,980 B2 | 9/2006 | Abbott et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,148,121 B2 | 9/2015 | Inoue | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,476,469 B2 | 11/2019 | Gong et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,812,048 B2 | 10/2020 | Nosaka | |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,114,996 B2 | 9/2021 | Plesski et al. | |
| 11,114,998 B2 | 9/2021 | Garcia et al. | |
| 11,139,794 B2 | 10/2021 | Plesski et al. | |
| 11,143,561 B2 | 10/2021 | Plesski | |
| 11,146,231 B2 | 10/2021 | Plesski | |
| 11,146,232 B2 | 10/2021 | Yandrapalli et al. | |
| 11,146,238 B2 | 10/2021 | Hammond et al. | |
| 11,146,244 B2 | 10/2021 | Yantchev | |
| 11,165,407 B2 | 11/2021 | Yantchev | |
| 11,171,629 B2 | 11/2021 | Turner | |
| 11,201,601 B2 | 12/2021 | Yantchev et al. | |
| 11,206,009 B2 | 12/2021 | Plesski | |
| 11,228,296 B2 | 1/2022 | Dyer | |
| 11,239,816 B1 | 2/2022 | McHugh | |
| 11,239,822 B2 | 2/2022 | Garcia | |
| 11,264,966 B2 | 3/2022 | Yantchev | |
| 11,264,969 B1 | 3/2022 | Fenzi | |
| 11,271,539 B1 | 3/2022 | Yantchev | |
| 11,271,540 B1 | 3/2022 | Yantchev | |
| 11,283,424 B2 | 3/2022 | Turner | |
| 11,309,865 B1 | 4/2022 | Guyette | |
| 11,323,089 B2 | 5/2022 | Turner | |
| 11,323,090 B2 | 5/2022 | Garcia | |
| 11,323,091 B2 | 5/2022 | Kay | |
| 11,323,095 B2 | 5/2022 | Garcia | |
| 11,323,096 B2 | 5/2022 | Yantchev | |
| 11,349,450 B2 | 5/2022 | Yantchev | |
| 11,349,452 B2 | 5/2022 | Yantchev | |
| 11,356,077 B2 | 6/2022 | Garcia | |
| 11,368,139 B2 | 6/2022 | Garcia | |
| 11,374,549 B2 | 6/2022 | Yantchev | |
| 11,381,221 B2 | 7/2022 | McHugh | |
| 11,496,113 B2 * | 11/2022 | Yantchev | H03H 3/02 |
| 2002/0079996 A1 | 6/2002 | Ruby et al. | |
| 2002/0130736 A1 | 9/2002 | Mukai | |
| 2002/0153970 A1 | 10/2002 | Noto | |
| 2002/0158714 A1 | 10/2002 | Kaitila et al. | |
| 2002/0189062 A1 | 12/2002 | Lin et al. | |
| 2003/0042998 A1 | 3/2003 | Edmonson | |
| 2003/0080831 A1 | 5/2003 | Naumenko et al. | |
| 2003/0199105 A1 | 10/2003 | Kub et al. | |
| 2004/0041496 A1 | 3/2004 | Imai et al. | |
| 2004/0100164 A1 | 5/2004 | Murata | |
| 2004/0130410 A1 | 7/2004 | Nishimura et al. | |
| 2004/0140866 A1 | 7/2004 | Taniguchi | |
| 2004/0233020 A1 | 11/2004 | Nakamura | |
| 2004/0261250 A1 | 12/2004 | Kadota et al. | |
| 2005/0077982 A1 | 4/2005 | Funasaka | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0152107 A1 | 7/2006 | Tanaka | |
| 2006/0179642 A1 | 8/2006 | Kawamura | |
| 2007/0030096 A1 | 2/2007 | Nichihara et al. | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2010/0019866 A1 | 1/2010 | Hara et al. | |
| 2010/0064492 A1 | 3/2010 | Tanaka | |
| 2010/0117483 A1 | 5/2010 | Tanaka | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |

(56) References Cited

U.S. PATENT DOCUMENTS

| | | |
|---|---|---|
| 2011/0109196 A1 | 5/2011 | Goto et al. |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0155373 A1 | 6/2017 | Ruby |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0181832 A1 | 6/2019 | Schmalzl et al. |
| 2019/0190487 A1 | 6/2019 | Yasuda |
| 2019/0245509 A1 | 8/2019 | Hurwitz |
| 2019/0253038 A1 | 8/2019 | Houlden |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0028481 A1 | 1/2020 | Sun et al. |
| 2020/0036357 A1 | 1/2020 | Mimura |
| 2020/0083861 A1 | 3/2020 | Matsuo |
| 2020/0177160 A1 | 6/2020 | Jachowski |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0350891 A1 | 11/2020 | Turner |
| 2021/0013859 A1 | 1/2021 | Turner et al. |
| 2021/0119595 A1 | 4/2021 | Turner et al. |
| 2021/0152154 A1 | 5/2021 | Tang |
| 2021/0265978 A1 | 8/2021 | Plesski et al. |
| 2021/0328574 A1 | 10/2021 | Garcia |
| 2021/0351762 A1 | 11/2021 | Dyer et al. |
| 2021/0399750 A1 | 12/2021 | Varela Campelo |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 00, 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 Tibtech Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

(56) References Cited

OTHER PUBLICATIONS

Reinhardt, "Acoustic filters based on thin single crystal LiNbQ,3 films: status and prospects", 2014 IEEE International Ultrasonics Symposium Proceedings, pp. 773-781 (Year: 2014).
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
Safari et al. "Piezoelectric for Transducer Applications" published by Elsevier Science Ltd., pp. 4 (Year: 2000). 2020.
Santosh, G., Surface acoustic wave devices on silicon using patterned and thin film ZnO, Ph.D. thesis, Feb. 2016, Indian Institute of technology Guwahati, Assam, India Feb. 2016.
Sinha et al., "Slanted finger Inter-digital Transducers for the design of improved performance small shape factor mid-bandwidth SAW filters", IEEE MTT-S International Microwave and RF Conference, 2013. (Year: 2013).
Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pp. 675 (Year 2015) Jan. 00, 2015.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Wu et al., "Frequency band-gap measurement of two-dimensional air/silicon phononic crystals using layered slanted finger interdigital transducers", J. Appl. Phys. 97, 094916, 2005 (Year: 2005).
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 00, 2015.

* cited by examiner

XBAR DEVICES WITH EXCESS PIEZOELECTRIC MATERIAL REMOVED

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent is a continuation of patent application Ser. No. 17/123,029, titled XBAR DEVICES WITH EXCESS PIEZOELECTRIC MATERIAL REMOVED, filed Dec. 15, 2020, which claims priority to U.S. provisional patent application No. 63/113,301, filed Nov. 13, 2020, which is incorporated here by reference.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Shear-Mode Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises an interdigital transducer (IDT) formed on a thin floating layer, membrane or diaphragm, of a piezoelectric material. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

The following describes improved XBAR resonators, filters and fabrication techniques for XBAR resonators with excess piezoelectric material removed. The excess piezoelectric material between conductors (other than the resonator IDTs) of an RF filter is removed to avoid exciting acoustic modes that then couple to the substrate and increase insertion loss. The excess piezoelectric material may be removed from between pairs of conductors outside of the XBAR resonators of an RF filter, such as from between a signal conductor and a ground conductor, or from between two signal conductors.

Figure 1:
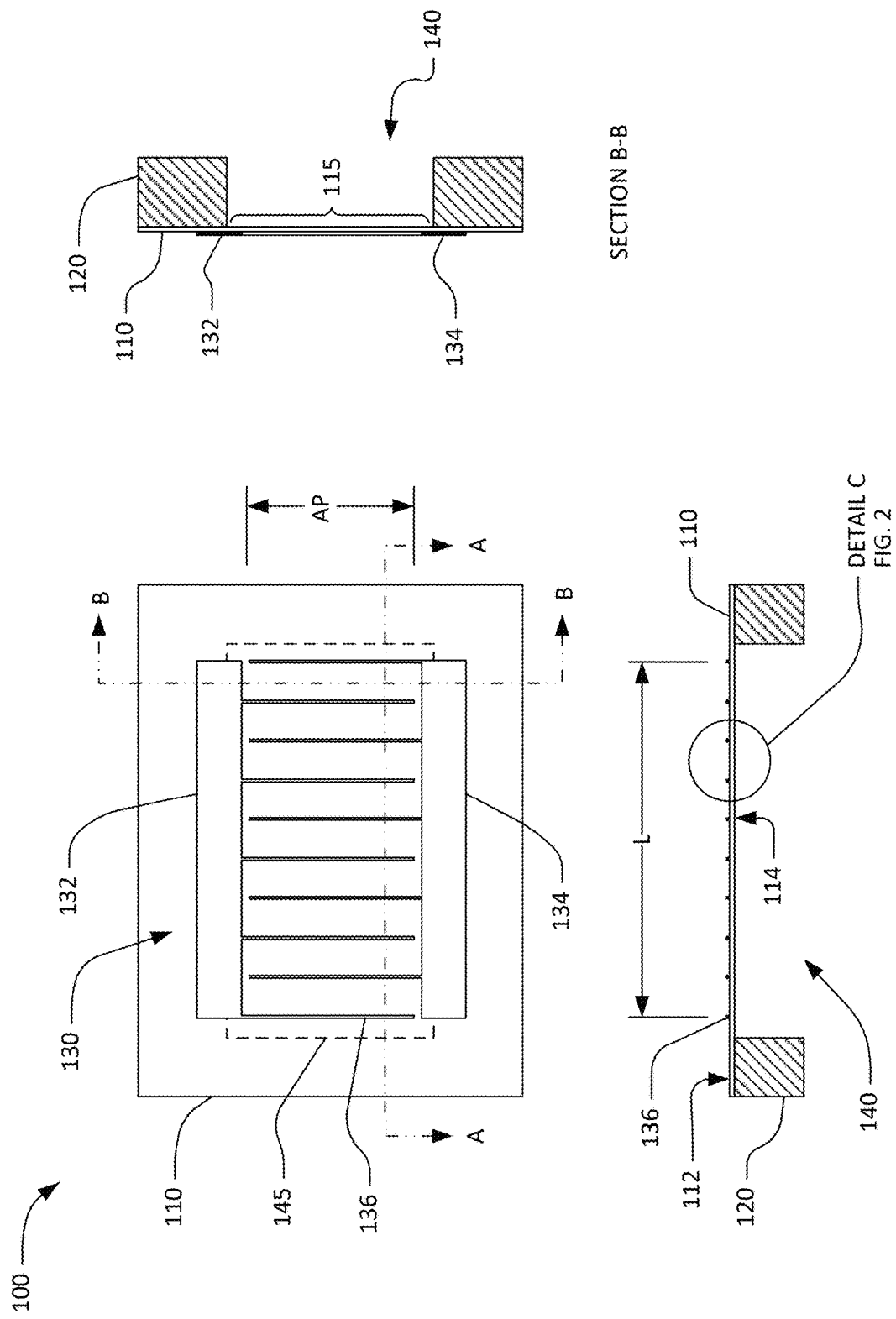
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers. As shown in FIG. 1, the diaphragm 115 is contiguous with the rest of the piezoelectric plate 110 around all of a perimeter 145 of the cavity 140. In this context, "contiguous" means "continuously connected without any intervening item".

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item".

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
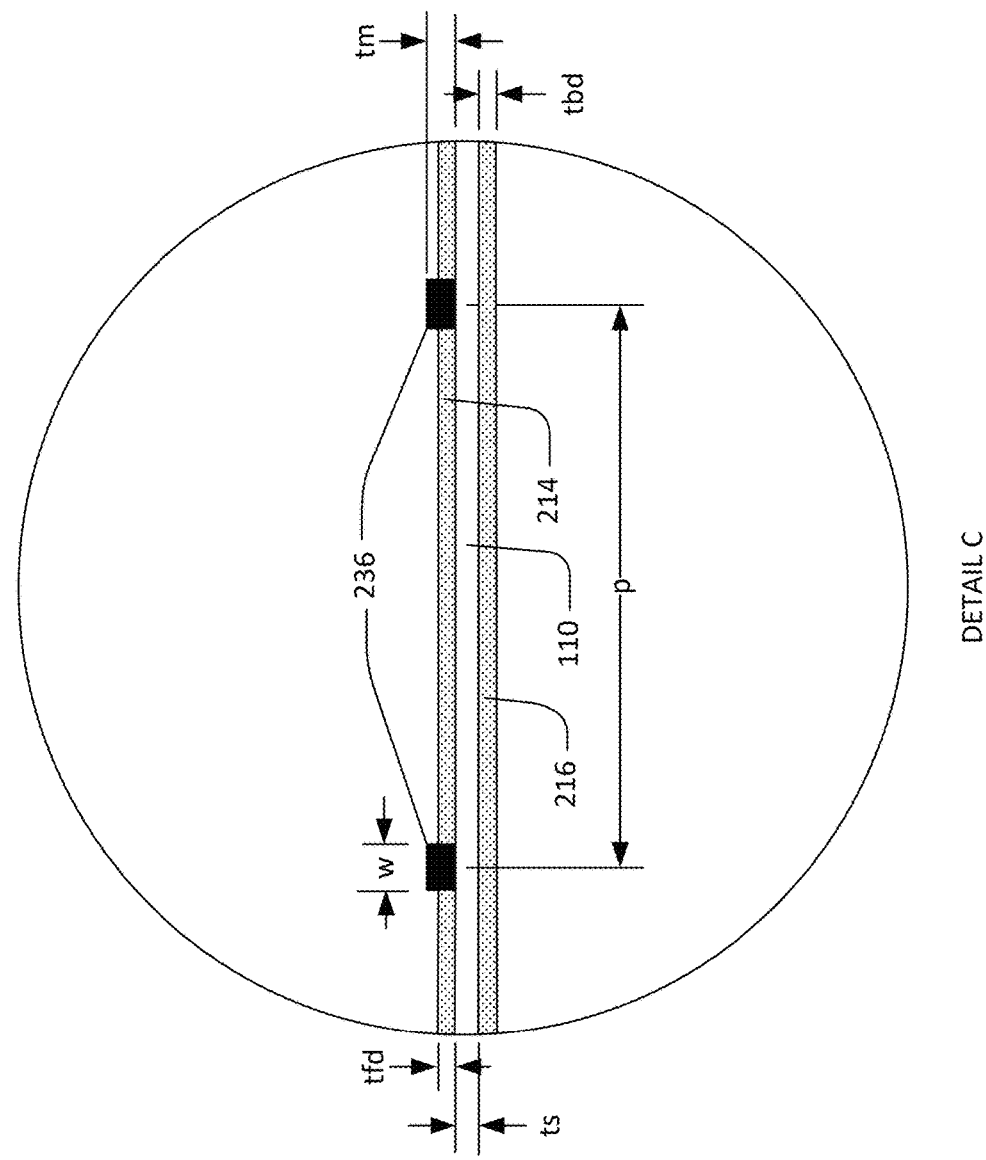
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as $SiO_2$ and $Si_3N_4$ material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
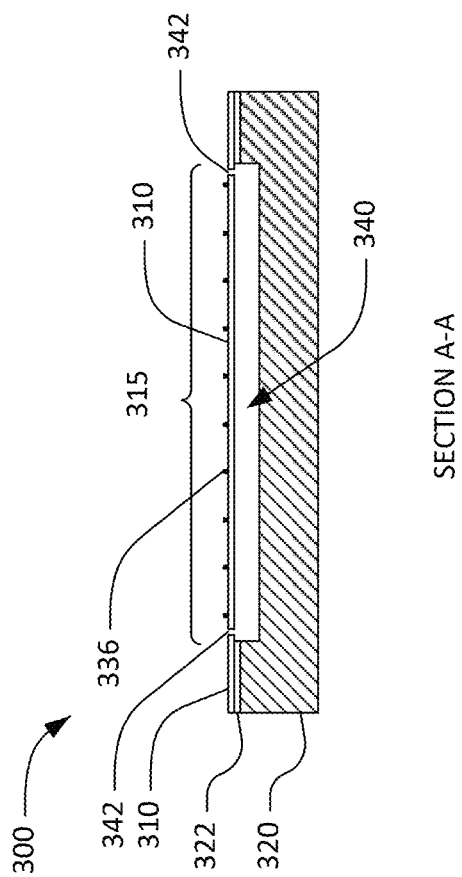
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be a bonding layer, an etch stop layer, a sealing layer, an adhesive layer or layer of other material that is attached or bonded to plate 310 and substrate 320. In other embodiments, the piezoelectric plate 310 is attached directly to the substrate 320 and an intermediary layer does not exist.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e. down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
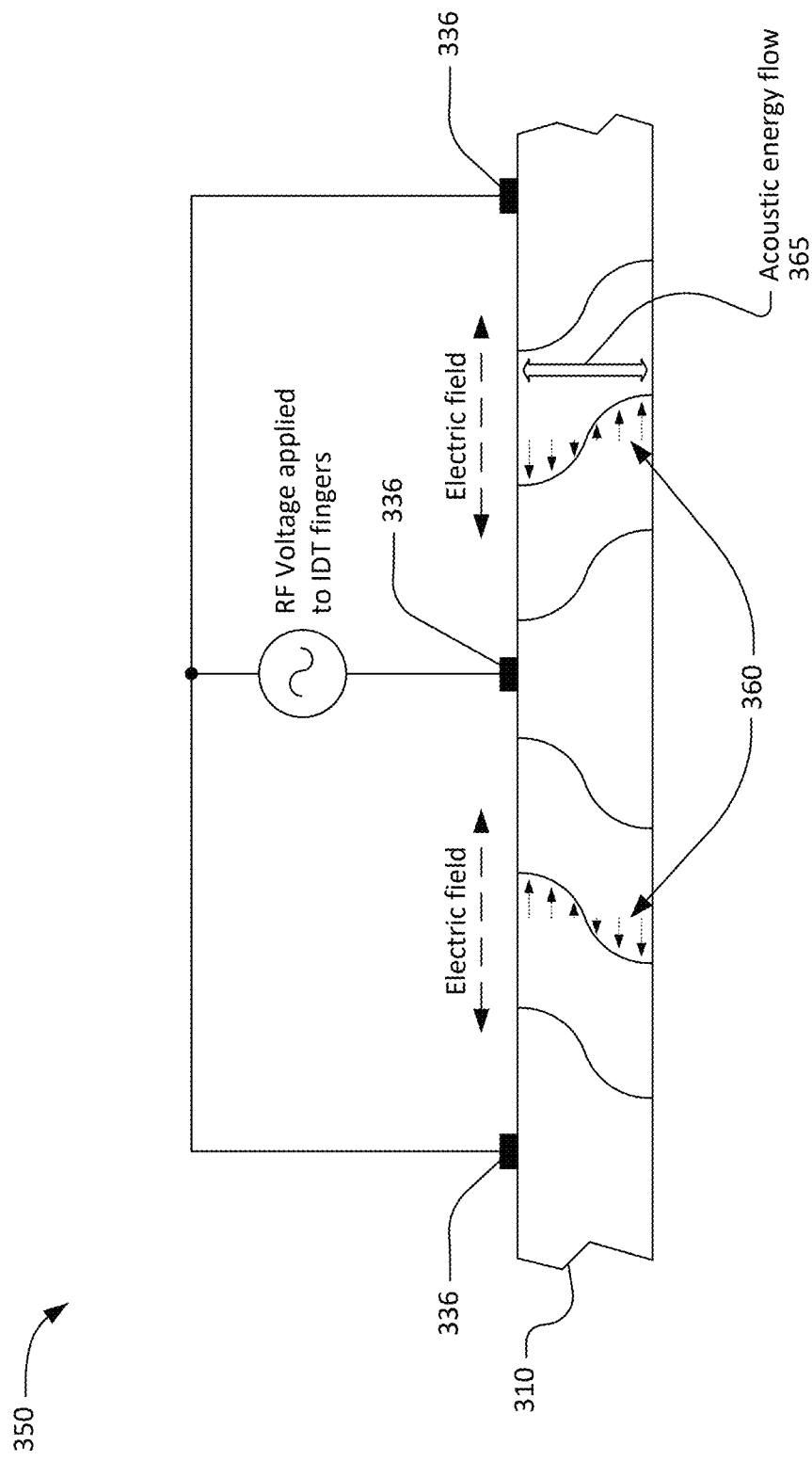
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4A:
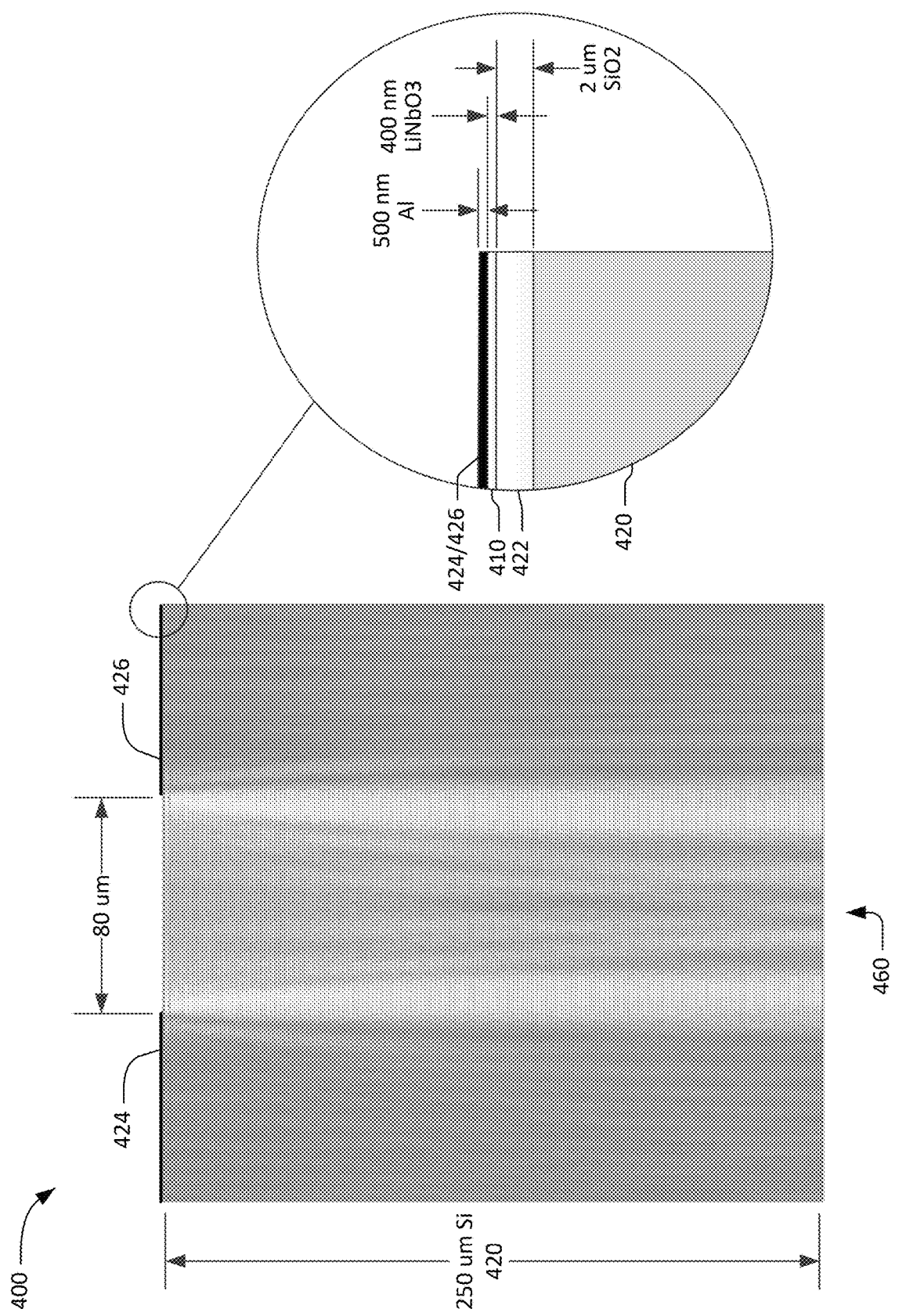
FIG. 4A is a cross-sectional view of a simulation of the acoustic modes excited between conductors in an XBAR device.

FIG. 4A is a cross-sectional view of a simulation of the acoustic modes 460 excited by two conductors 424 and 426 in an XBAR device 400. The device includes a 400 nm thick layer of lithium niobate piezoelectric material 410 bonded to a silicon substrate 420 that is 250 µm thick. A 2 micron thick silicon dioxide bonding layer 422 is disposed between the piezoelectric layer 410 and the substrate 420. The bonding layer may be Al2O3 or SiO2. Bonding layer 422 may be bonded to layer 410 and substrate 420, thus bonding them together. Two conductors 424 and 426 (e.g., electrodes) are formed on the top surface of piezoelectric layer 410. The conductors represent, for example, a signal electrode and a ground electrode on the surface of an XBAR filter. The conductors may be a certain distance past the perimeter of any cavity of a resonator of the device, such as a certain distance noted for FIG. 5B. The electrodes are aluminum, 500 nm thick, and separated by 80 microns. The piezoelectric layer 410 and bonding layer 422 extend across the 80 micron separation without being bonded to or covered by the conductors.

A radio frequency electric field between the conductors 424 and 426 (as would occur if 424 and 426 are a signal conductor and a ground conductor in a filter) excites a shear acoustic mode in the piezoelectric layer 410 between the conductors. The acoustic mode travels through the bonding layer and the substrate. If the back surface of the substrate is polished, the acoustic mode reflects such that the surface of the piezoelectric plate and the back surface of the substrate form a resonant cavity. If the back surface of the substrate is textured (for example by grinding) the acoustic mode is dispersed after reflection.

Figure 4B:
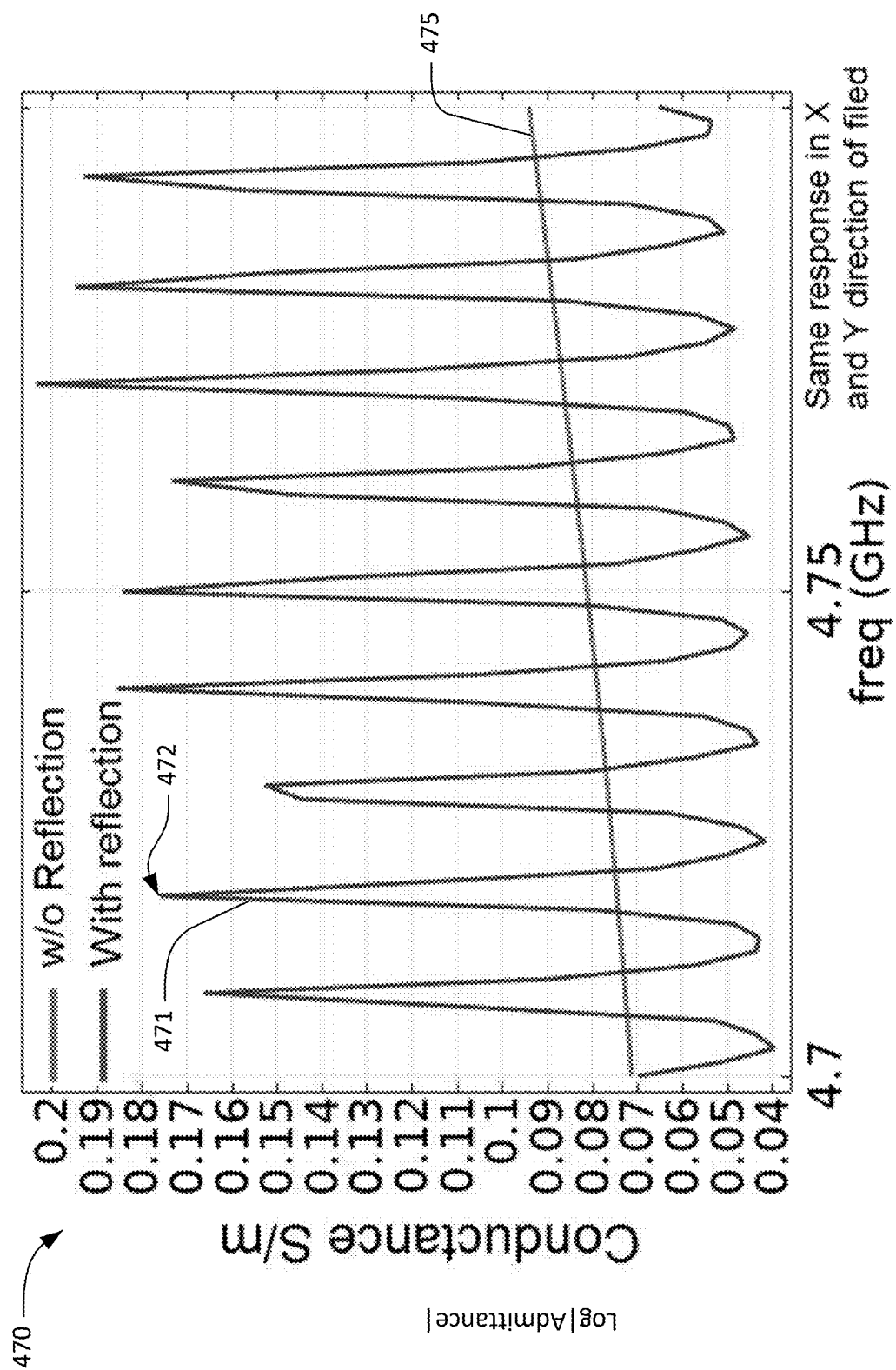
FIG. 4B is a graph of the conductance of the structure shown in FIG. 4A

FIG. 4B is a graph 470 of the Conductance (in Siemens per meter of conductor length) of the structure shown in FIG. 4A as a function of frequency (GHz). The curve 471 is a plot of the conductance when the back surface of the silicon substrate 420 is polished. In this case, the top surface of the piezoelectric layer and the back surface of the substrate form a cavity that results in resonance peaks 472 separated by about 10 MHz. These resonance peaks may result in undesired effects such as ripple within the passband of the filter having device 400. The curve 475 is a plot of the conductance when the back surface of the silicon substrate is suitably textured (e.g. fine ground). In this case, the resonance peaks do not form. The residual conductance contributes to the insertion loss of the filter. This increase in insertion loss can be detrimental to filter performance.

Figure 5A:
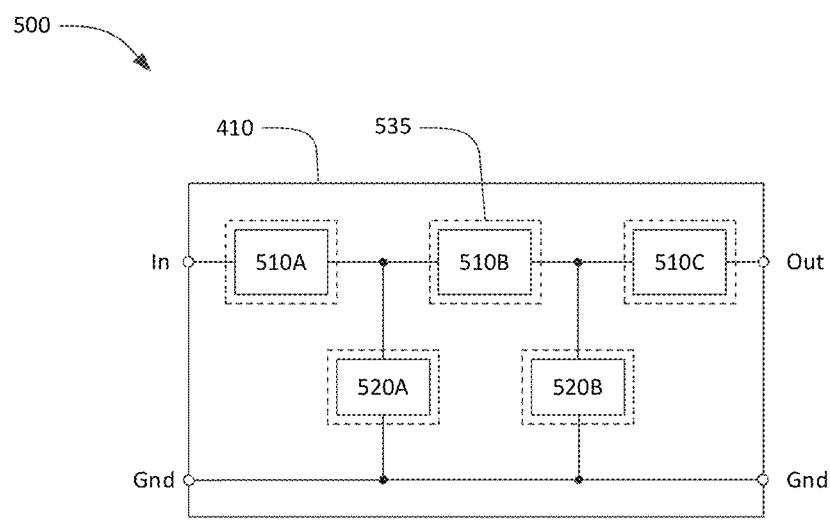
FIG. 5A is a schematic circuit diagram and layout for a high frequency band-pass filter using XBARs.

FIG. 5A is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port. In FIG. 5A, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs on a single die.

The three series resonators 510A, B, C and the two shunt resonators 520A, B of the filter 500 are formed on a single plate 410 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5A, the cavities are illustrated schematically as the dashed rectangles (such as the rectangle 535). In this example, each IDT is disposed over a respective cavity. In other filters, the IDTs of two or more resonators may be disposed over a single cavity.

In some cases, to produce improved XBAR resonators and filters with excess piezoelectric material removed, the portions or areas of the piezoelectric material of plate 410 that extend a certain distance past the perimeter 545 of the cavities of filter 500 (or cavity perimeter 135 of FIG. 1) may be removed. This removing may include removing the piezoelectric material: a) that extends in the length direction past the perimeter of the cavity by between 2 and 25 percent more the length of the cavity; and b) that extends in the width direction past the perimeter of the cavity by between 2 and 25 percent more the width of the cavity. This removing may include removing the excess piezoelectric material between conductors (other than the resonator IDTs) of an RF filter to avoid exciting acoustic modes that then couple to the substrate and increase insertion loss. This removing may include removing the excess piezoelectric material from between pairs of conductors outside of the XBAR resonators of an RF filter, such as from between a signal conductor and a ground conductor, or from between two signal conductors.

Figure 5B:
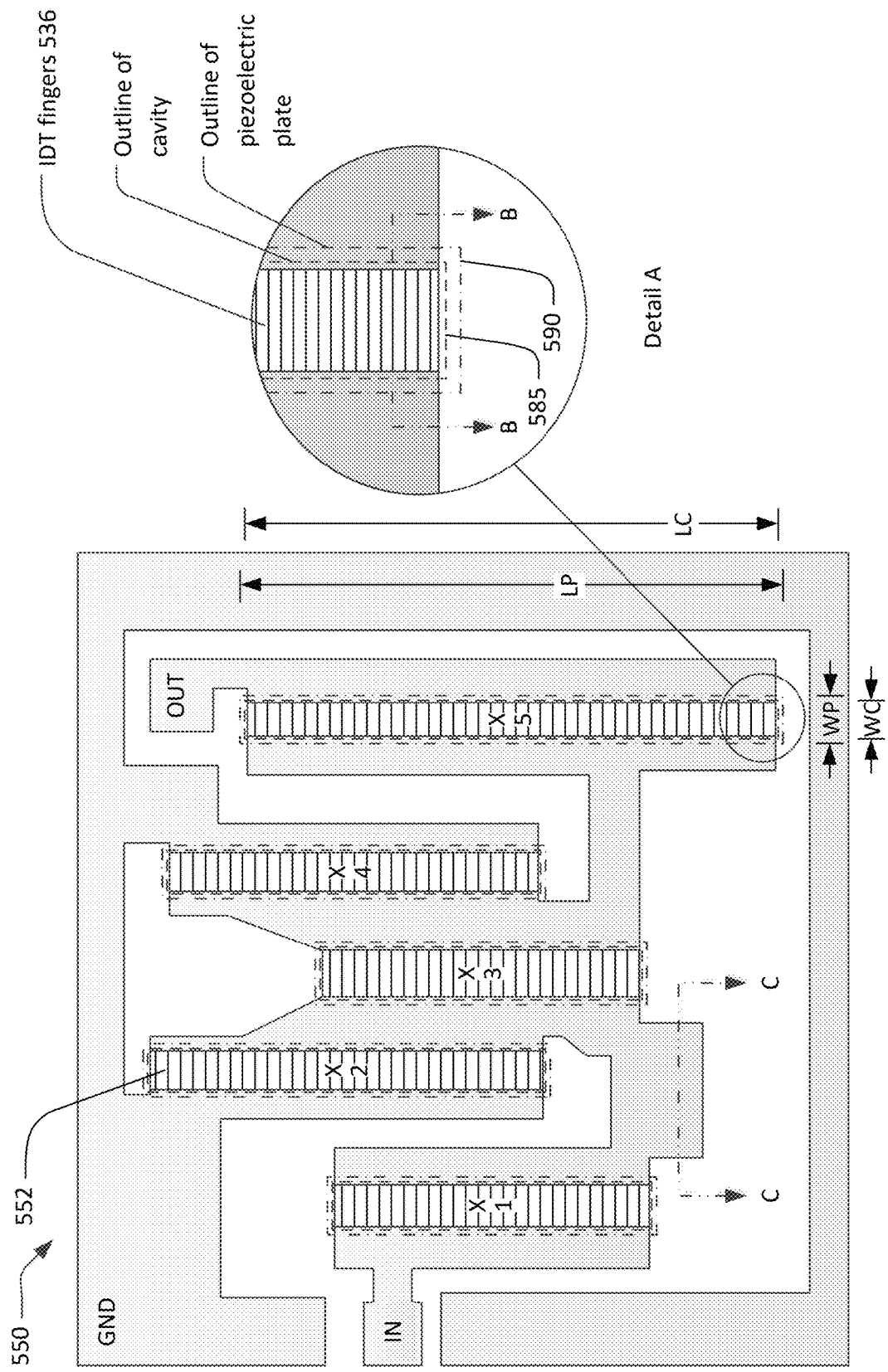
FIG. 5B is a schematic plan view of a filter incorporating five XBAR devices.

FIG. 5B is a schematic plan view of a filter 550 incorporating five XBAR devices labeled "X1" to "X5". The filter 550 is exemplary and does not represent any particular application. The filter 550 includes five XBAR devices X1-X5. Filter 550 may be filter 500 of FIG. 5A, where device X1 is series resonator 510A, device X2 is shunt resonator 520A, device X3 is series resonator 510B, device X4 is shunt resonator 520B, and device X5 is series resonator 510C. The filter 550 may be formed on a single die. A "die" may be a semiconductor chip or integrated circuit (IC) chip that is diced from other chips such as of a wafer. It may be a monolithic integrated circuit (also referred to as an IC, a chip, or a microchip) that has a set of electronic circuits on one small flat piece (or "chip") of semiconductor material that is normally silicon.

The horizontally-hatched areas 552 represent the IDT and/or fingers of the XBAR devices. The fingers of the IDTs are not to scale. FIG. 5B shows a ground (GND) conductor of the filter 550 which may be connected to or part of busbars on one side of the XBARs X2 and X4 as shown. The GND conductor is connected to a ground signal of the filter 550. FIG. 5B shows an input (IN) signal conductor of the filter 550 which may be connected to or part of busbars on one side of the XBAR X1 as shown. The IN conductor is connected to an input signal for the filter 550. FIG. 5B shows an output (OUT) signal conductor of the filter 550 which may be connected to or part of busbars on one side of the XBAR X5 as shown. The OUT conductor is connected to an output signal for the filter 550.

FIG. 5B and detail A show the dashed lines outline of the cavity perimeters, such as perimeter 585 behind the IDT fingers. Perimeter 585 may represent a cavity perimeter such as perimeter 135 or 535. FIG. 5B and detail A also show the dot-dash lines perimeter of the piezoelectric material perimeters, such as perimeter 590. Perimeter 590 may represent a perimeter of the piezoelectric material that: a) extends in the piezoelectric material length direction LP past the perimeter of the cavity length LC by more than 5, 10 or 20 percent of the length of the cavity LC; and b) that extends in the piezoelectric material width direction WP past the perimeter of the perimeter of the cavity width WC by more than 5, 10 or 20 percent of a width of the cavity WC. This may be true for any one or more (up to all) of the five XBAR devices X1-X5.

The piezoelectric material may be removed from the entire surface of the filter 550 except within the rectangles defined by the dot-dash lines, such as perimeter 590 and the similar perimeters of XBAR devices X1-X4. The outlines of the cavities and the piezoelectric layer are shown as rectangles for ease of presentation but may have other shapes. For example, the perimeters of the cavities and piezoelectric layers may be irregular polygons or generally rectangular with non-straight (e.g. curved, serrated, or wavy) sides.

Figure 5C:
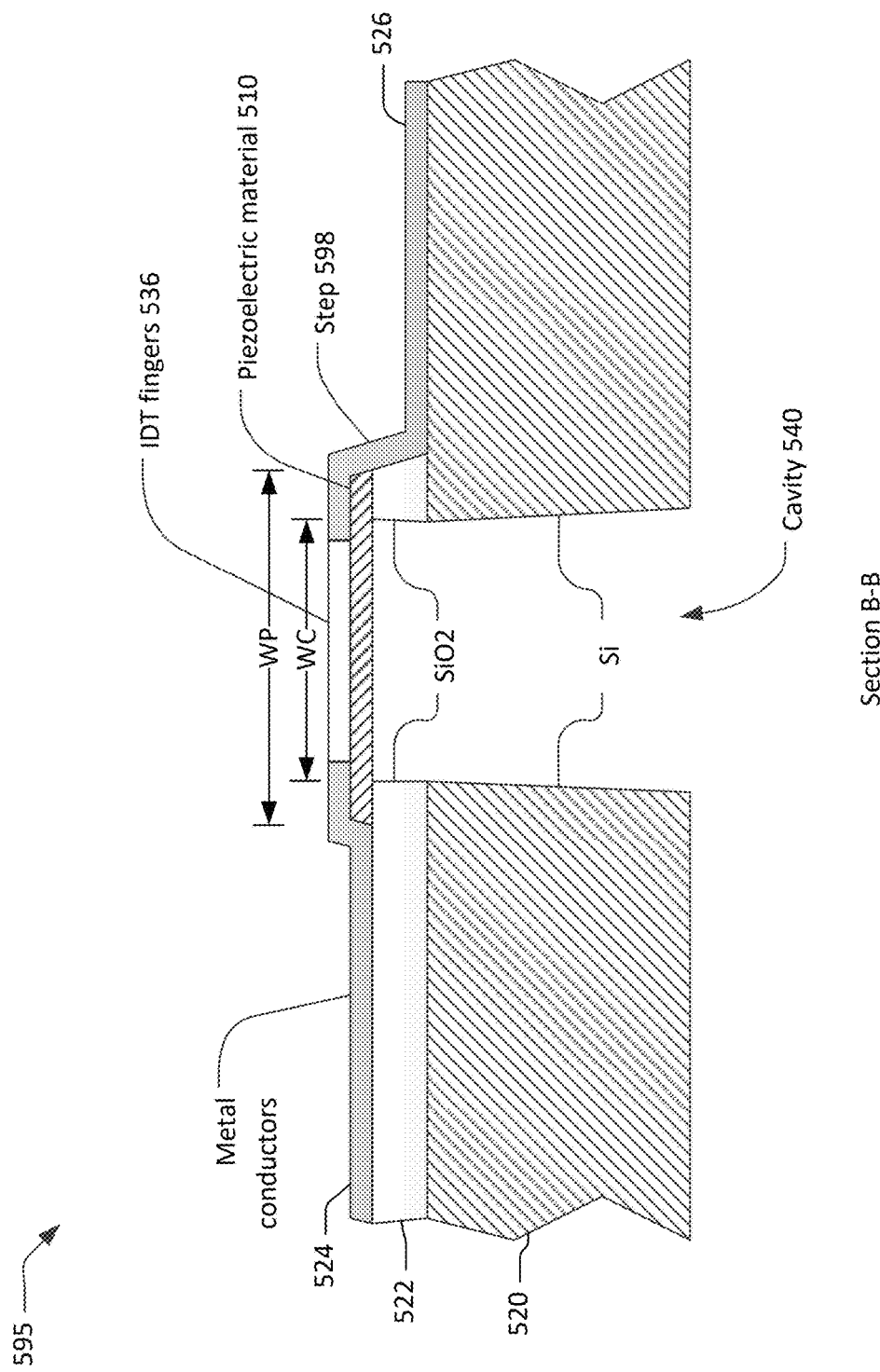
FIG. 5C is a schematic cross-sectional view at the plane B-B defined in Detail A of FIG. 5B.

FIG. 5C is a schematic cross-sectional 595 view at the plane B-B defined in Detail A of FIG. 5B. FIG. 5C shows filter device X5 comprising substrate 520 having cavity 540. The substrate has additional cavities where devices X1-X4 are formed and may be a single die. Bonding layer 522 is formed on the substrate but is not over the cavity 540. Piezoelectric plate 510 is bonded to the bonding layer 522 and spans the cavity 540. In some cases, layer 522 does not exist and the plate is directly attached to the substrate. An interdigital transducer (IDT) formed on a front surface of the piezoelectric plate 510 has interleaved fingers 536 over the cavity 540. Although the conductors are shown as metal, they may be another proper conductive material. Although the substrate is shown as silicon, it may be another proper substrate material. Although the bonding layer is shown as silicon dioxide, it may be another proper bonding material.

The Piezoelectric plate 510 includes the diaphragm having piezoelectric material spanning the cavity and excess portions that extend a certain length past the perimeter of the cavity. The excess portions may extend a certain length and width distance (LP and WP) past the length and width perimeter of the cavity (LC and WC). The excess portions may be a perimeter of the piezoelectric material that extends in the length and width direction past the perimeter of the cavity by: a) more than 5, 10 or 20 percent; or b) between 2 and 25 percent.

Fingers 536 may span or be over cavity 540. In some cases, part of the busbars of the IDT is also over the cavity. In other cases, all of the busbars are over the substrate 520 but not over the cavity. At least portions of the busbars are over the substrate (e.g., not over the cavity) to better conduct heat generated in the IDT to the substrate.

The thicknesses of the piezoelectric layer 510, bonding layer 522, fingers 536, and metal conductors 524 and 526 are greatly exaggerated for ease of depiction. The left side of FIG. 5C illustrates the case where the piezoelectric layer 510, but not the SiO$_2$ bonding layer 522, is removed outside of the area of the resonator cavity 540, such as removed from extending beyond width WP. The right side of FIG. 5C illustrates the case where both the piezoelectric layer 510 and the bonding layer 522 are removed outside of the area of the resonator cavity 540, such as removed from extending beyond width WP. This rightside configuration provides an improved thermal connection between the metal conductor 524 and the Si substrate 520, but requires the metal conductor cover a larger height step 598 than on the left side.

Figure 5D:
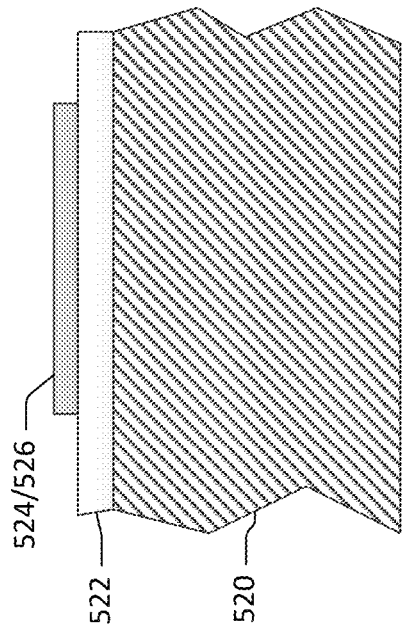
FIGS. 5D, 5E, 5F, and 5G are schematic cross-sectional views at the plane C-C defined in FIG. 5B.
Figure 5F:
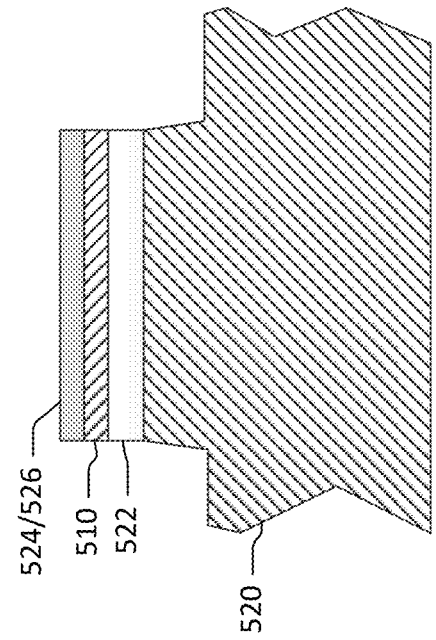
Figure 5E:
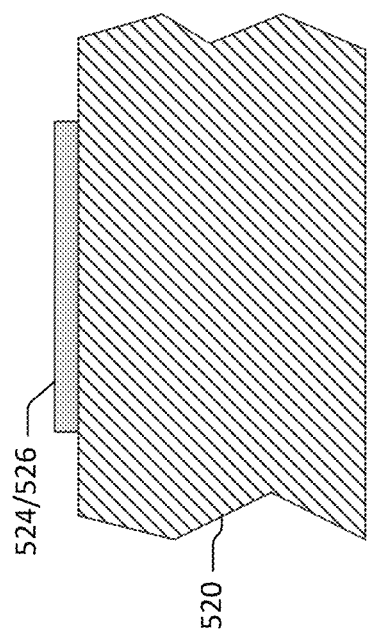
Figure 5G:
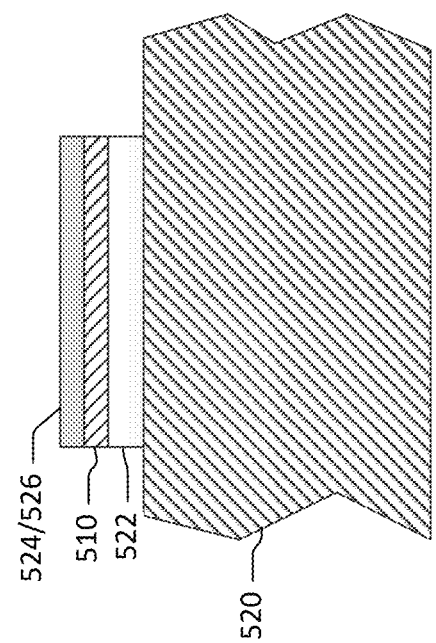

FIGS. 5D, 5E, 5F, and 5G are schematic cross-sectional views at the plane C-C defined in FIG. 5B. These views show a cross-section though a conductor 524/526 remote from a resonator, such as noted for FIGS. 4A-5C. FIG. 5D and FIG. 5E are consistent with the right and left sides of FIG. 5C, respectively. FIG. 5F is an alternative configuration in which the excess piezoelectric material 510 is removed after the conductor patterns 524 and 526 are formed. In this case, the piezoelectric layer 510 and the SiO$_2$ bonding layer 522 remain beneath the conductor. This configuration eliminates acoustic losses without requiring the conductors to cover steps 598 in the underlying layers. FIG. 5G extends the configuration of 5F by removing a portion of the Si substrate 520 between conductors 524 and 526 to reduce stray capacitance.

Figure 6:
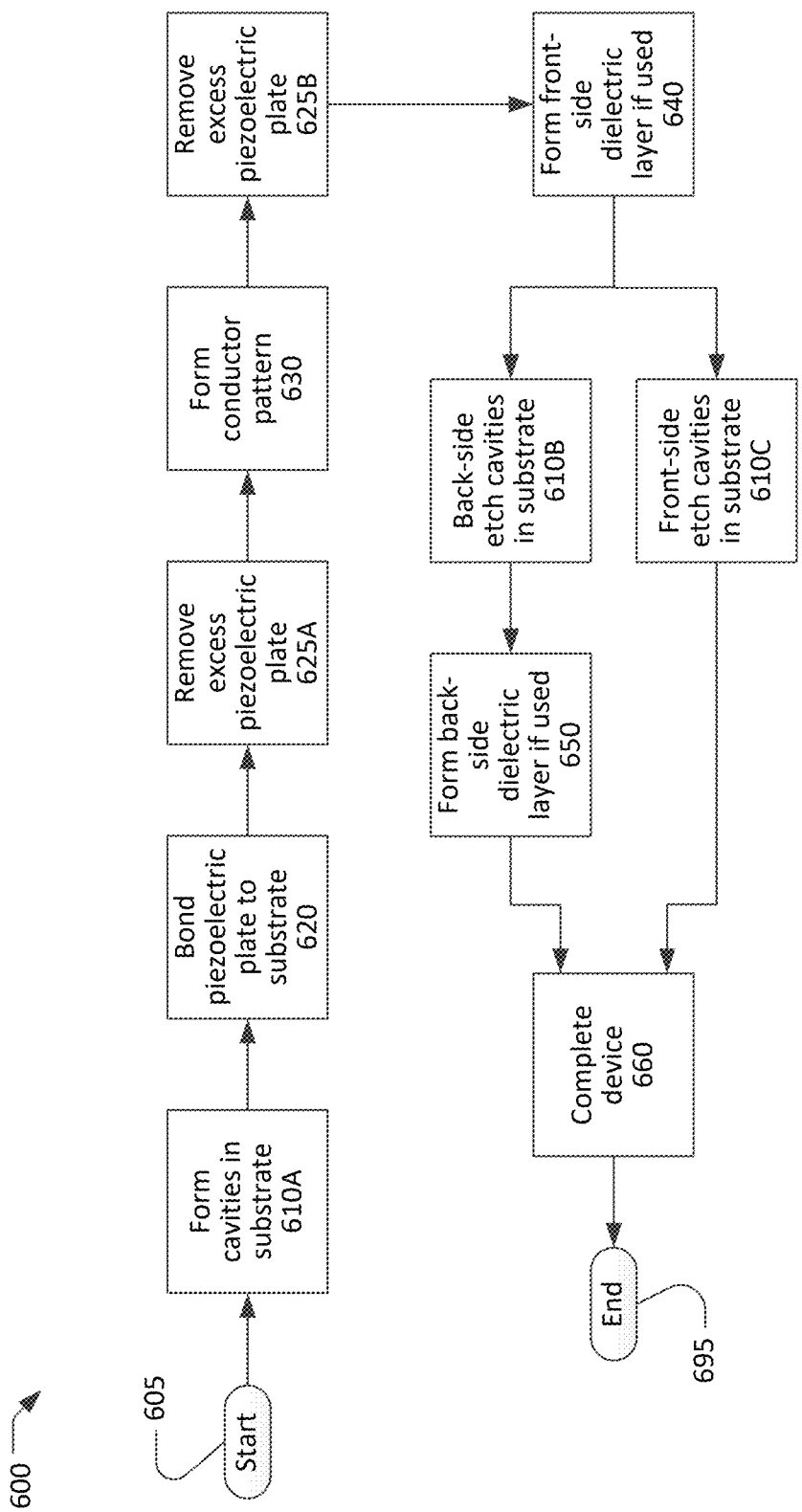
FIG. 6 is a flow chart showing a process for making an XBAR having excess piezoelectric material removed.

FIGS. 5B, 5C, 5D, and 5E illustrate a conceptually easy solution to the problems of FIGS. 4A-B, which is to etch away the undesired portions of the piezoelectric plate 510 immediately after bonding the plate 510 to the substrate 520 or bonding layer 522 (e.g., at 625A in FIG. 6). FIGS. 5F and 5G illustrate an alternative process sequence where the undesired portions of the piezoelectric plate 510 are etched (e.g., at 625B in FIG. 6) after the conductors 524 and 526 are formed. The benefit of the alternative process is that the conductors do not have to go over steps where the piezoelectric plate has been removed, such as shown at step 598 of FIG. 5C. The conductor thickness is typically 500 nm and the piezoelectric plate thickness is typically 400 nm which may cause a conductor bonding problem at or near the step, such as gaps between the conductor and bonding layer or substrate. These step may also cause other fabrication problems.

One problem being solved by removing the portions of the piezoelectric material that extend a certain distance LP and WP past the perimeter of the cavity LC and WC of an XBAR resonator is caused by piezoelectric material between conductors, such as in the 80 μm gap between conductors 424 and 426 as noted for FIGS. 4A-B. Piezoelectric material under the conductors such as under conductors 424 and 426 as noted for FIGS. 4A-B, or for FIGS. 5D-G does not excite acoustic modes.

Description of Methods

FIG. 6 is a simplified flow chart showing a process 600 for making an XBAR having excess piezoelectric material removed or a filter incorporating XBARs having excess piezoelectric material removed. This is the same as the process defined in pending application Ser. No. 16/438,121, which is incorporated herein by reference, with the added step of removing the excess piezoelectric material at 625A before the conductor patterns are formed or at 625B after the conductor patterns are formed. The process 600 starts at 605 with a substrate and a plate of piezoelectric material and ends at 695 with a completed XBAR or filter having excess piezoelectric material removed, such as shown for FIGS. 5A-5G. As will be described subsequently, the piezoelectric plate may be mounted on a sacrificial substrate or may be a portion of wafer of piezoelectric material. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The flow chart of FIG. 6 also captures two variations of the process 600 for making an XBAR which differ in when and how excess piezoelectric material is removed. The excess piezoelectric material may be removed at step 625A or 625B. Only one of these steps is performed in each of these two variations of the process 600. In another variation, some of the excess piezoelectric material may be removed at step 625A and more if it removed at step 625B.

The piezoelectric plate may be, for example, Z-cut, rotated Z-cut, or rotated Y-cut lithium niobate or lithium tantalate or a material noted for plate 110. The piezoelectric plate may be some other material and/or some other cut. The substrate may be silicon. The substrate may be some other material that allows formation of deep cavities by etching or other processing. The silicon substrate may have layers of silicon TOX and polycrystalline silicon.

In one variation of the process 600, one or more cavities are formed in the substrate at 610A, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers. In some cases, bonding layer 522 may be used to bond the plate to the substrate.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

In one variation of the process 600, at 625A the portions of the piezoelectric material that extend a certain distance past the perimeter of the cavity of the XBAR resonator are removed after the piezoelectric plate is bonded to the substrate at 620 and before the conductor pattern is formed at 630. This may be removing piezoelectric material extending beyond LP and WP of the resonator. The portions may be removed by patterning and etching to remove the piezoelectric material that extends a certain distance past the perimeter of the cavity. Removing the portions of piezoelectric material may include removing bonding layer 522 that is below the excess portions of the piezoelectric layer that are removed. In other cases, it does not and those portions of layer 522 remain. Here, bonding layer 522 can be used as an etch stop for removing the excess portions piezoelectric material.

Removing the portions of piezoelectric material may include removing the piezoelectric material: a) that extends in the length direction past the perimeter of the cavity by more than between 2 and 25 percent the length of the cavity; and b) that extends in the width direction past the perimeter of the cavity by more than between 2 and 25 percent the width of the cavity. This removing may include removing the excess piezoelectric material between conductors (other than the resonator IDTs) of an RF filter to avoid exciting acoustic modes that then couple to the substrate and increase insertion loss. This removing may include removing the excess piezoelectric material from between pairs of conductors outside of the XBAR resonators of an RF filter, such as from between a signal conductor and a ground conductor, or from between two signal conductors.

Removing the portions of piezoelectric material may only be removing piezoelectric material between conductors, such as in the 80 μm gap between conductors 424 and 426 as noted for FIGS. 4A-B. Piezoelectric material under the conductors such as under conductors 424 and 426 as noted for FIGS. 4A-B, or for FIGS. 5D-G is not removed.

Figure 7:
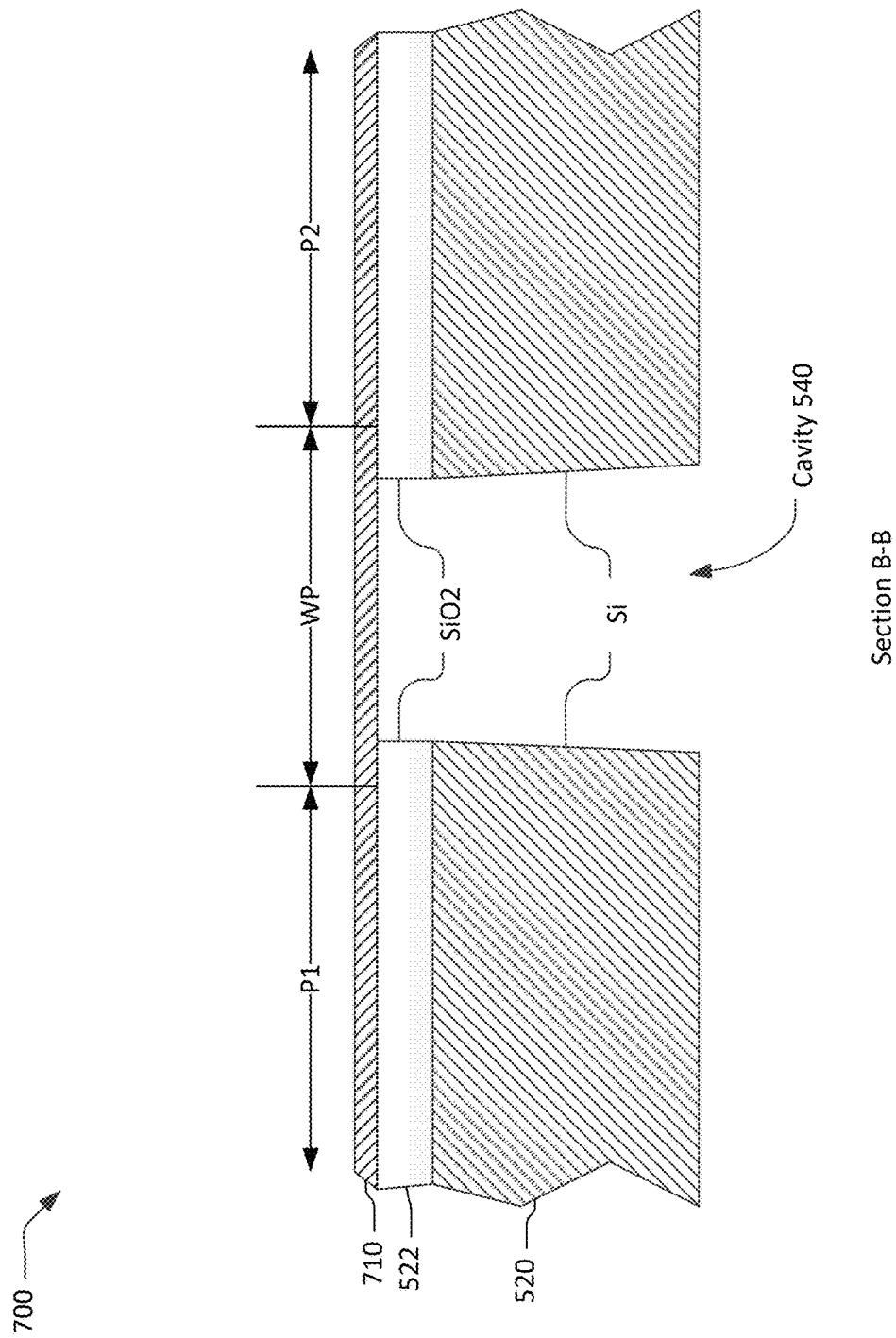
FIG. 7 is a schematic cross-sectional view of an XBAR resonator at the plane B-B defined in Detail A of FIG. 5B prior to removing excess piezoelectric material.

FIG. 7 is a schematic cross-sectional view at the plane B-B defined in FIG. 5B of an XBAR resonator 700 prior to removing excess piezoelectric material. This view illustrates the case where the piezoelectric layer 710 has excess portions P1 and P2 to be removed from outside of the area of the resonator cavity 540, such as removed from extending beyond width WP and length LP (not shown). The excess portions P1 and P2 of layer 710 can be removed with or without removing the bonding layer 522 from those portions. The portions P1 and P2 may be removed by patterning and etching layer 710. Removing portions P1 and P2 may include removing bonding layer 522 below portions P1 and P2, such as noted at 625A and 625B; and/or may include removing the conductor pattern above portions P1 and P2, such as noted at step 625B. After portions P1 and P2 are removed, resonator 700 may be further processed to become an XBAR having excess piezoelectric material removed as noted herein, such as for FIGS. 5C-5G.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDTs are formed prior to bonding the plate to the substrate.

In another variation of the process 600, at 625B the portions of the piezoelectric material that extend a certain distance past the perimeter of the cavity of the XBAR resonator are removed after the conductor pattern is formed at 630 and before front side dielectric is optionally formed at 640. This may be removing piezoelectric material as noted at step 625A and/or FIG. 7. The portions may be removed by patterning and etching to remove the piezoelectric material that extends a certain distance past the perimeter of the cavity.

Removing this piezoelectric material may include removing conductor pattern that is above the excess portions of the piezoelectric layer that are removed. Removing the portions of piezoelectric material may include removing bonding layer 522 that is below the excess portions of the piezoelectric layer that are removed. In other cases, it does not and those portions of layer 522 remain. Here, bonding layer 522 can be used as an etch stop for removing the excess portions piezoelectric material.

Removing the portions of piezoelectric material may include removing piezoelectric material beside the IDTs or where the IDTs are not formed. It may include removing piezoelectric material beside or where the conductor material and conductors are not formed.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate top layer 322 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate top layer 322, and the resulting resonator devices will have a cross-section as shown in FIG. 3A.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-3B and 5B-5C may show examples of the fingers of selected IDTs after completion at 660.

Forming the cavities at 610A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 610B requires additional handling inherent in two-sided wafer processing. Forming the cavities from the back side also greatly complicates packaging the XBAR devices since both the front side and the back side of the device must be sealed by the package.

Forming the cavities by etching from the front side at 610C does not require two-sided wafer processing and has the advantage that the XBAR diaphragms are supported during all of the preceding process steps. However, an etching process capable of forming the cavities through openings in the piezoelectric plate will necessarily be isotropic. However, such an etching process using a sacrificial material allows for a controlled etching of the cavity, both laterally (i.e. parallel to the surface of the substrate) as well as normal to the surface of the substrate.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device comprising:
    at least one piezoelectric layer spanning a cavity;
    wherein the at least one piezoelectric layer is not provided in at least one excess portion that extends a certain length past a perimeter of the cavity; and
    a first interdigital transducer (IDT) at a surface of the at least one piezoelectric layer and having interleaved fingers over the cavity,
    wherein the at least one excess portion is at least one of a length and a width of a perimeter of the at least one piezoelectric layer spanning the cavity and that extends past a perimeter of the cavity by more than 2 percent and less than 25 percent of the at least one of a length and a width of the cavity.

2. The filter device of claim 1, wherein the at least one of the length and the width of the perimeter of the at least one piezoelectric layer spanning the cavity extends past the perimeter of the cavity by more than 5 percent of the width of the cavity.

3. The filter device of claim 1, further comprising:
    an intermediate layer on the substrate;
    wherein the at least one piezoelectric layer is attached to the intermediate layer;

wherein the intermediate layer is not provided in excess portions that extend the certain length past the perimeter of the cavity.

4. The filter device of claim 3, wherein the substrate is Si, the intermediate layer is SiO2 and the IDT is metal.

5. The filter device of claim 4, wherein the at least one piezoelectric layer is one of lithium niobate or lithium tantalate.

6. A filter device comprising:
a substrate;
at least one intermediate layer on the substrate;
at least one piezoelectric layer at least partially attached to the at least one intermediate layer and spanning a first cavity and a second cavity;
wherein the at least one piezoelectric layer is not provided in at least one excess portion that extends a certain length past perimeters of the first cavity and of the second cavity, respectively;
a first interdigital transducer (IDT) on a surface of the at least one piezoelectric layer and having interleaved fingers over the first cavity;
a second IDT on a surface of the at least one piezoelectric layer and having interleaved fingers over the second cavity; and
at least one conductor attaching the first IDT to the second IDT.

7. The filter device of claim 6, wherein respective radio frequency signals applied to the first and second IDTs excite respective primary shear acoustic modes in the at least one piezoelectric layer over the first and second cavities.

8. The filter device of claim 7, wherein a thickness of the at least one piezoelectric layer is configured to tune the primary shear acoustic modes in the at least one piezoelectric layer.

9. The filter device of claim 6, further comprising connections to the first and second IDTs that form an RF filter input and output, respectively.

10. A filter device comprising:
a substrate;
a piezoelectric layer connected directly or by one or more intermediate layers to the substrate and spanning a cavity having a perimeter;
an interdigital transducer (IDT) on a surface of the piezoelectric layer and having interleaved fingers over the cavity,
wherein the piezoelectric layer is not provided in excess portions that extend past a certain length of at least a portion of the perimeter of the cavity, and
wherein a radio frequency signal applied to the IDT excites a primary shear acoustic mode in the piezoelectric layer over the cavity.

11. The filter device of claim 10, wherein the one or more intermediate layers are disposed directly on the substrate and attach the piezoelectric layer to the substrate.

12. The filter device of claim 11, wherein the one or more intermediate layers are not provided in excess portions that extend a certain length past the perimeter of the cavity.

13. The filter device of claim 11, wherein the substrate is Si, the intermediate layer is SiO2, the IDT is metal, and the piezoelectric layer is one of lithium niobate or lithium tantalate.

14. The filter device of claim 10, wherein a thickness of the piezoelectric layer is configured to tune the primary shear acoustic mode in the piezoelectric layer.

* * * * *